(12) United States Patent
Xue et al.

(10) Patent No.: US 11,462,699 B2
(45) Date of Patent: Oct. 4, 2022

(54) DISPLAY PANEL, METHOD FOR MANUFACTURING THE SAME AND DISPLAY DEVICE

(71) Applicant: BOE Technology Group Co., Ltd., Beijing (CN)

(72) Inventors: Jinxiang Xue, Beijing (CN); Zhongyuan Sun, Beijing (CN); Xiaofen Wang, Beijing (CN); Wenqi Liu, Beijing (CN); Kai Sui, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 174 days.

(21) Appl. No.: 16/886,035

(22) Filed: May 28, 2020

(65) Prior Publication Data

US 2021/0050535 A1   Feb. 18, 2021

(30) Foreign Application Priority Data

Aug. 14, 2019 (CN) .......................... 201910748198.4

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3276* (2013.01); *H01L 51/003* (2013.01);
(Continued)

(58) Field of Classification Search
CPC ............. H01L 51/0097; H01L 27/3276; H01L 51/003; H01L 51/5253; H01L 51/56;
(Continued)

(56) References Cited

U.S. PATENT DOCUMENTS

2015/0062467 A1\* 3/2015 Kang .................... G06F 3/0446
349/12

FOREIGN PATENT DOCUMENTS

CN        206480628 U       9/2017
CN        108269501 A       7/2018
(Continued)

OTHER PUBLICATIONS

First Office Action dated Mar. 18, 2021 for application No. CN201910748198.4 with English translation attached.
(Continued)

*Primary Examiner* — Kyoung Lee
(74) *Attorney, Agent, or Firm* — Nath, Goldberg & Meyer; Joshua B. Goldberg

(57) ABSTRACT

A display panel, a method for manufacturing the display panel and a display device are provided. The display panel includes a flexible substrate, a surface of which is provided with a plurality of protrusions; a plurality of organic light-emitting elements disposed on the flexible substrate, at least a portion of the plurality of organic light-emitting elements being located within regions where the protrusions are located. Therefore, parts with the organic light-emitting elements can be stepped by utilizing the protrusions of the flexible substrate, so a thickness of the flexible substrate except the protrusions can be effectively reduced, and the display panel can be in contact with other structures by utilizing the protrusions, so that the portion of the flexible substrate except the protrusions has a deformation space of higher freedom, and a tensile strength of the display panel can be improved.

15 Claims, 6 Drawing Sheets

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2227/323* (2013.01); *H01L 2227/326* (2013.01); *H01L 2251/5338* (2013.01)

(58) Field of Classification Search
CPC ......... H01L 2227/323; H01L 2227/326; H01L 2251/5338; H01L 27/3279; H01L 27/32; H01L 27/3244; H01L 51/5237; Y02P 70/50; Y02E 10/549
See application file for complete search history.

(56) References Cited

FOREIGN PATENT DOCUMENTS

| | | |
|---|---|---|
| CN | 108305892 A | 7/2018 |
| CN | 108550587 A | 9/2018 |
| CN | 109742119 A | 5/2019 |
| CN | 109841660 A | 6/2019 |
| KR | 20190071283 A | 6/2019 |

OTHER PUBLICATIONS

Second Office Action dated Sep. 29, 2021 corresponding to Chinese application No. 201910748198.4.

\* cited by examiner

DISPLAY PANEL, METHOD FOR MANUFACTURING THE SAME AND DISPLAY DEVICE

CROSS-REFERENCE TO RELATED APPLICATIONS

The present application claims the priority of the Chinese Patent Application No. 201910748198.4, filed on Aug. 14, 2019, the contents of which are incorporated herein in their entirety by reference.

TECHNICAL FIELD

The present disclosure relates to the field of display technology, in particular to a display panel, a method for manufacturing the display panel and a display device.

BACKGROUND

An organic light-emitting diode (OLED) display, also called an organic electroluminescent display, has advantages of low power consumption, high brightness, wide operating temperature range, thin and light volume, fast response speed, easy realization of color display and large-screen display, easy realization of flexible display, and the like, and thus has a wide application prospect. With development of organic light-emitting display technology in recent years, foldable and rollable flexible display devices have received much attention. In the current flexible display device, a stretchable structure is usually provided to relieve a stress generated during a deformation process such as folding, rolling, etc.

SUMMARY

The present disclosure provides a display panel, a method for manufacturing the display panel and a display device.

In an aspect, the present disclosure provides a display panel. The display panel includes: a flexible substrate having a first surface and a second surface opposite to the first surface, wherein the first surface is provided with a plurality of protrusions; a plurality of organic light-emitting elements, the plurality of organic light-emitting elements are arranged on the second surface of the flexible substrate, and orthographic projections of at least a portion of the plurality of organic light-emitting elements on the flexible substrate are located in regions where the plurality of protrusions are located. Therefore, parts with the organic light-emitting elements can be stepped by utilizing the protrusions of the flexible substrate, so that a thickness of the flexible substrate except the protrusions can be effectively reduced, and the display panel can be in contact with other structures by utilizing the protrusions, thereby a portion of the flexible substrate except the protrusions has a deformation space of higher freedom, and a tensile strength of the display panel can be improved.

According to an embodiment of the present disclosure, the display panel further includes a lead connecting two adjacent organic light-emitting elements, and at least a portion of an orthogonal projection of the lead on the flexible substrate is located outside the regions where the protrusions are located. Since the portion of the flexible substrate outside the regions where the protrusions are located is not in contact with other structures, a multi-dimensional deformation space can be formed at the portion of the flexible substrate outside the regions where the protrusions are located, and therefore a tensile strength of a region where the lead is located can be improved.

According to an embodiment of the present disclosure, the flexible substrate has a hollow portion and a connection portion, the hollow portion is located between the plurality of protrusions, any two adjacent protrusions are connected through the connection portion, and the lead is located in the connection portion of the flexible substrate.

According to an embodiment of the present disclosure, heights of the plurality of protrusions are equal to each other, a thickness of the flexible substrate at the protrusions ranges from 5 micrometers to 20 micrometers, and a minimum thickness of the flexible substrate is not less than 2 micrometers. Therefore, the protrusions can be used for being in contact with other structures, and a multi-dimensional deformation space is provided for the portion of the flexible substrate except the protrusions.

According to an embodiment of the present disclosure, the display panel further includes: a back film arranged on a side of the flexible substrate distal to the organic light-emitting elements, each of the protrusions is provided with a platform on its side distal to the organic light-emitting elements, the platform is provided with a first adhesive layer, and the back film is adhered to the flexible substrate through the first adhesive layer. Furthermore, a second adhesive layer is provided on a side, facing the flexible substrate, of the back film, and the back film is adhered to the flexible substrate through the first adhesive layer and the second adhesive layer. Therefore, the flexible substrate can be in contact with the back film only through the protrusions, and the tensile strength of the display panel can be further improved.

According to an embodiment of the present disclosure, the display panel further includes: a protection layer positioned on a side of the flexible substrate, which is provided with the organic light-emitting elements, and the protection layer covers the organic light-emitting elements.

According to an embodiment of the present disclosure, the flexible substrate has a curved portion that is convex towards the back film, the curved portion is located between two adjacent protrusions, and a gap is provided between the flexible substrate and the protection layer at the curved portion.

In another aspect, the present disclosure provides a method for manufacturing the display panel described above, the method including preparing a flexible substrate having a plurality of protrusions so that the flexible substrate has a first surface and a second surface opposite to the first surface, the plurality of protrusions being disposed on the first surface; and a plurality of organic light-emitting elements arranged on the second surface of the flexible substrate, and orthographic projections of at least a portion of the plurality of organic light-emitting elements on the flexible substrate are positioned in regions where the plurality of protrusions are positioned.

According to an embodiment of the present disclosure, the preparing the flexible substrate having the plurality of protrusions includes: coating a material of forming the flexible substrate on a template having a plurality of main recesses, the plurality of main recesses being used for forming the plurality of protrusions of the flexible substrate. The preparing the flexible substrate having the plurality of protrusions further includes forming a connection portion between adjacent protrusions, and the forming the connection portion includes: coating a material of forming the flexible substrate on the template with a connection recess between two adjacent main recesses, and a depth of the connection recess is less than that of the main recesses, and the connection recess is used for forming the connection portion.

According to an embodiment of the present disclosure, the method further includes: after forming the plurality of organic light-emitting elements on the first surface of the flexible substrate, forming a lead for connecting two organic light-emitting elements by depositing metal on the connection portion of the flexible substrate.

According to an embodiment of the present disclosure, the method further includes: after forming the lead for connecting two organic light-emitting elements, etching a portion of a material of the flexible substrate to form a hollow portion so that the hollow portion is located between the plurality of protrusions, and there is no overlapping region between an orthographic projection of the hollow portion on the template and an orthographic projection of the lead on the template; forming a protection layer on a side of the organic light-emitting elements distal to the flexible substrate, so that the protection layer covers the organic light-emitting elements; peeling off the flexible substrate formed with the protection layer from the template; and providing a back film on a side of the flexible substrate distal to the protection layer.

According to an embodiment of the present disclosure, the providing the back film on the side of the flexible substrate distal to the protection layer includes: providing an adhesive layer on a side of the plurality of protrusions distal to the organic light-emitting elements and/or on the back film, and adhering the back film to the flexible substrate through the adhesive layer.

According to an embodiment of the present disclosure, the method further includes: before the back film is adhered to the flexible substrate through the adhesive layer, stretching the back film along an adhering plane in advance, and after the back film is adhered to the flexible substrate, causing the back film to restore to a state before the stretching.

According to an embodiment of the present disclosure, the peeling off the flexible substrate formed with the protection layer from the template includes: peeling off the flexible substrate formed with the protection layer from the template by laser.

According to an embodiment of the present disclosure, the method includes forming a release layer prior to coating the material of the flexible substrate on the template; and the peeling off the flexible substrate formed with the protection layer from the template includes removing the release layer to peel off the flexible substrate from the template.

In yet another aspect, the present disclosure provides a display device including the display panel described above.

DESCRIPTION OF DRAWINGS

The above and/or additional aspects and advantages of the present disclosure will become apparent and readily appreciated from the following description of the embodiments, taken in conjunction with the accompanying drawings in which.

DESCRIPTION OF EMBODIMENTS

Figure 1:
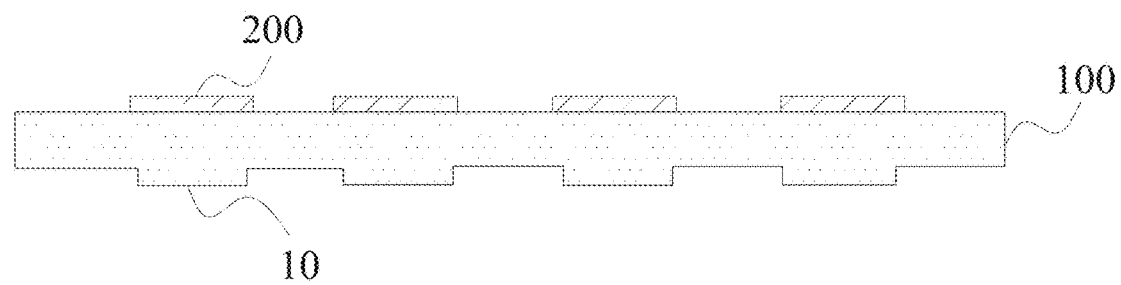
FIG. 1 shows a schematic structural diagram of a display panel according to an embodiment of the present disclosure.

Reference will now be made in detail to the embodiments of the present disclosure, examples of which are illustrated in the accompanying drawings, in which like reference numerals refer to the same or similar elements or elements having the same or similar functions throughout. The embodiments described below with reference to the accompanying drawings are illustrative only for the purpose of explaining the present disclosure, and are not to be construed as limiting the present disclosure.

In the description of the present disclosure, the terms "upper", "lower", and the like indicate orientations or positional relationships based on those shown in the drawings, which are merely for convenience of describing the present disclosure and do not require that the present disclosure must be constructed and operated in a specific orientation, and thus, should not be construed as limiting the present disclosure.

In an aspect, the present disclosure provides a display panel. Referring to FIG. 1, the display panel includes a flexible substrate 100 and a plurality of organic light-emitting elements 200. A first surface of the flexible substrate 100 is provided with a plurality of protrusions 10, and the plurality of organic light-emitting elements 200 are all disposed on a second surface of the flexible substrate 100 distal to the protrusions 10. Orthogonal projections of at least a portion of the plurality of organic light-emitting elements 200 on the flexible substrate 100 are located within regions where orthogonal projections of the protrusions 10 on the flexible substrate 100 are located. Specifically, the flexible substrate 100 may be a flexible film layer formed of polyimide (PI), etc., the second surface of the flexible film layer may be flat so as to make the plurality of organic light-emitting elements 200 disposed thereon, and the first surface thereof may be provided with the plurality of protrusions 10 in stepped shape. That is, in the present application, the protrusions 10 are portions of the flexible substrate 100. Therefore, parts with the organic light-emitting elements can be stepped by utilizing the protrusions of the flexible substrate, so that a thickness of the flexible substrate except the protrusions can be effectively reduced, and the display panel can be in contact with other structures by utilizing the protrusions, thereby a portion of the flexible substrate except the protrusions 10 has a deformation space of higher freedom, and a tensile strength of the display panel can be improved.

For ease of understanding, the following first briefly explains a principle that the display panel according to the embodiment of the present disclosure can achieve the above-described advantageous effects.

As described above, compared with a liquid crystal display device, an organic light-emitting display device may include a flexible substrate, and the organic light-emitting display technology is more advantageous for implementing a flexible display device based on a luminescence principle, a structure and material characteristics of an organic light-emitting diode. However, a package structure of an organic light-emitting element still has a fragile portion, which cannot be bent at will, and thus a stretching structure may be disposed in a flexible display panel to improve an overall stretching performance of the flexible display panel, for example, island structures for accommodating organic light-emitting elements and a bridge (i.e., a bridging unit) connecting the island structures may be reserved in the flexible substrate, on one hand, when the display panel is stretched, the bridging unit can release stress first, so as to reduce stress strains of display units in the island structures and prevent the organic light-emitting elements from being damaged in stretching, and on the other hand, the bridging unit can accommodate structures such as metal leads. However, the inventors have found that when the flexible display panel is in contact with another member or when it is necessary to bond the flexible substrate to a back film, the bridge unit of the above planar "island-bridge structure" is constrained by a structure such as the back film, and can be deformed only in a surface parallel to the back film during stretching, so that a function of the bridge unit to release stress is weak, and an entire stress releasing capability of the display panel is weak. In contrast, according to the display panel of the embodiment of the present disclosure, the flexible substrate has the protrusions on the side thereof, away from the organic light-emitting elements, so when the flexible substrate needs to be fixed to another structure, for example, needs to be adhered to the back film, a fixing operation such as adhesion can be performed by using the protrusions. Relatively depressed portions of the flexible substrate do not need to be in contact with structures such as the back film and the like. Therefore, the flexible substrate at positions of the relatively depressed portions can have a deformation space of higher freedom, and can deform in a plane parallel to the surface of the flexible substrate and in a dimension perpendicular to the flexible substrate, so that the tensile strength of the display panel can be improved.

Hereinafter, respective structures of the display panel will be described in detail according to specific embodiments of the present disclosure.

According to an embodiment of the present disclosure, regions where the plurality of protrusions 10 are located may serve as the island structures in which the organic light-emitting elements 200 are disposed as described above. Since each of the organic light-emitting elements 200 needs to be packaged by a package structure to isolate an organic light-emitting layer from water and oxygen, and a thickness of the flexible substrate at the protrusions is thick, the flexible substrate at positions of the protrusions is relatively not easy to deform when an operation such as adhering the flexible substrate to the back film is performed, and the organic light-emitting elements 200 can be protected by disposing the organic light-emitting elements 200 at the positions corresponding to the protrusions 10. Heights of the plurality of projections 10 may be equal to each other, which facilitates the back film to be adhered. Since the protrusions play a role in adhering with other components, the thickness at the protrusions can be consistent with that of a current flexible substrate film layer. In contrast, the flexible substrate 100 except the protrusions, for example, a depression adjacent to the protrusions 10 as shown in the drawing, may have a thickness thinner than that of a conventional flexible substrate. For example, the thickness of the flexible substrate 100 at the protrusions according to the embodiment of the present disclosure may range from 5 microns to 20 microns. The minimum thickness of the flexible substrate may be not less than 2 microns, whereby it can be ensured that the flexible substrate as a whole has a sufficient mechanical strength. Thus, the protrusions can be utilized to make contact with other structures to provide a multi-dimensional deformation space for the flexible substrate in the regions thereof other than the protrusions.

It should be noted that, a specific area of each of the protrusions 10 is not particularly limited. For example, an area of an orthographic projection of each of the protrusions 10 on the flexible substrate may coincide with or be slightly larger than an area of orthographic projection of each of the organic light-emitting elements on the flexible substrate, so that orthographic projections of the organic light-emitting elements on the flexible substrate 100 entirely fall within the regions of the protrusions 10, alternatively, the region of each of the protrusions 10 may be slightly smaller than the region of each of the organic light-emitting elements, so that a small portion of an edge of the orthographic projection of each of the organic light-emitting elements 200 on the flexible substrate 100 falls outside the regions of the protrusions 10. That is, in the present disclosure, at least a portion of the orthographic projections of the organic light-emitting elements 200 on the flexible substrate are located within the regions where the protrusions 10 are located. In addition, all of the organic light-emitting elements 200 on the flexible substrate 100 may be located in the regions where the protrusions 10 are located, or there may be a few organic light-emitting elements 200 not located in the regions where the protrusions 10 are located.

Figure 2:
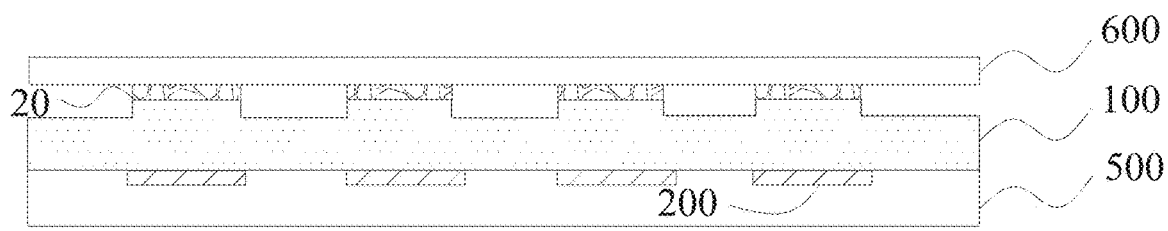
FIG. 2 shows a schematic structural diagram of a display panel according to an embodiment of the present disclosure.
Figure 3:
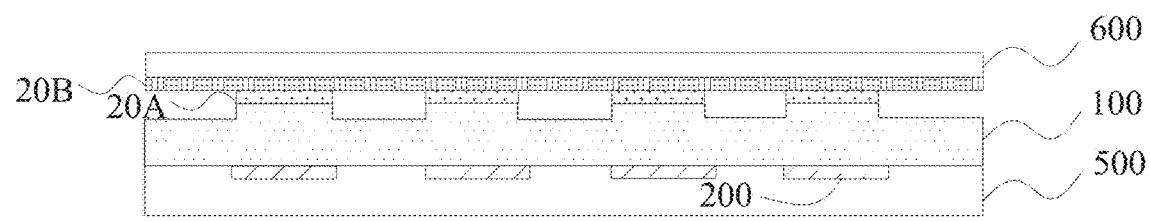
FIG. 3 shows a schematic structural diagram of a display panel according to an embodiment of the present disclosure.

According to an embodiment of the present disclosure, referring to FIG. 2 and FIG. 3, the display panel may further include a back film 600, a protection layer 500, and other structures. The back film 600 is disposed on a side of the flexible substrate 100 away from the organic light-emitting elements 200, and may be adhered to the protrusions of the flexible substrate through an adhesive layer 20 (such as the adhesive layer 20 shown in FIG. 2, or the first adhesive layer 20A and the second adhesive layer 20B shown in FIG. 3) or the like. Each of the protrusions may have a platform on a surface thereof away from the organic light-emitting elements 200 to facilitate adhesion of the back film and improve flatness of a structure formed after adhesion. The protection layer 500 may be located on a side of the flexible substrate 100 having the organic light-emitting elements 200, and the protection layer 500 covers the organic light-emitting elements 200 to further protect the organic light-emitting elements 200 from being damaged.

According to an embodiment of the present disclosure, the back film 600 may be peeled off when the display panel is assembled in a display device, and the back film 600 may protect the display panel during transportation and storage. The specific manner in which the back film 600 is fixed to the flexible substrate 100 is not particularly limited, and for example, referring to FIG. 2, the adhering of the back film 600 may be achieved by disposing an optical adhesive on platforms of the protrusions. Alternatively, as shown in FIG. 3, adhesive layers may be disposed on a side of the back film 600 to be in contact with the flexible substrate 100 and on the protrusions, that is, the first adhesive layer 20A directly contacting the protrusions 10 and the second adhesive layer 20B directly contacting the back film 600, where the first adhesive layer 20A may be acrylic modified epoxy or epoxy resin, and may also contain a catalyst and other additives. The second adhesive layer 20B may be a modified amine or other hardener, and may also contain a catalyst and other auxiliaries. Then, curing is carried out, namely, the first adhesive layer 20A and the second adhesive layer 20B can be used for realizing bonding of the flexible substrate 100 and the back film. Components of the adhesive layers 20A and 20B may be mixed in a certain ratio, wherein the catalyst may control a curing time, and the other additives may control properties of the adhesive layers, such as viscosity, stiffness, flexibility, adhesion, and the like.

Figure 8:
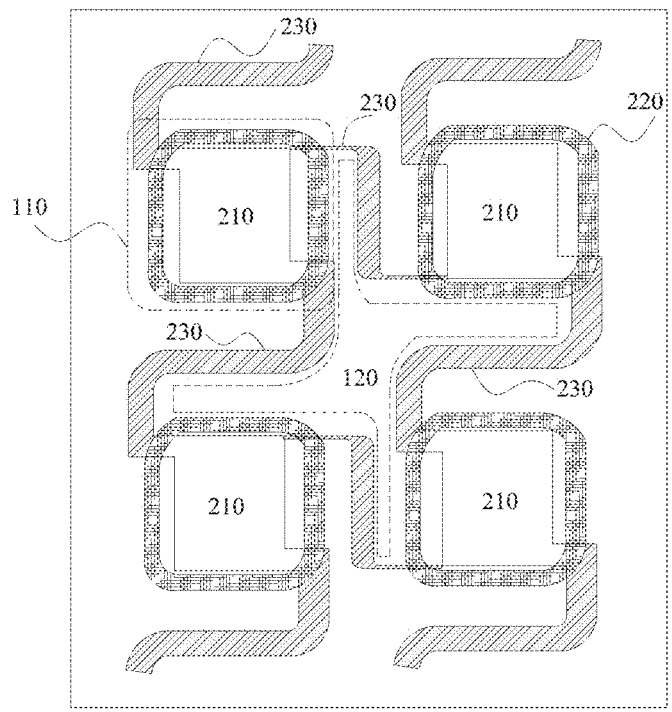
FIG. 8 is a schematic diagram illustrating a partial structure of a display panel according to an embodiment of the present disclosure.

According to an embodiment of the present disclosure, referring to FIG. 8, the display panel may further include a lead 230. As described above, the organic light-emitting elements may include organic light-emitting diodes 210 and package structures 220 for packaging the organic light-emitting diodes 210. That is, the flexible substrate may have a plurality of display unit regions 110 (regions shown by square dashed boxes in the figure) for disposing the organic light-emitting elements. Only the side of the flexible substrate where the organic light-emitting elements are disposed is shown in FIG. 8, the protrusions are not shown in the drawing, and the positions of the protrusions may be regions where the display unit regions 110 are located. The lead 230 may connect two adjacent organic light-emitting elements, and at least a portion of an orthogonal projection of the lead 230 on the flexible substrate is located outside the regions where the protrusions are located. As mentioned above, the flexible substrate in the regions of the protrusions is thicker, and the flexible substrate in the other region is thinner. Therefore, the flexible substrate outside the regions where the protrusions are located cannot contact with other structures, so that the flexible substrate at the position outside the regions where the protrusions are located can have a multidimensional deformation space, and the tensile strength of the region where the lead is located can be improved.

According to an embodiment of the present disclosure, in order to further improve the tensile strength of the display panel, the flexible substrate may further have a hollow portion 120 (an region shown by a special-shaped dashed line box in the figure) and a connection portion on the side of the flexible substrate where the plurality of organic light-emitting diodes 210 are disposed, an orthogonal projection of the hollow portion 120 on the flexible substrate is located between the plurality of protrusions, the material of the flexible substrate at the hollow portion 120 is removed, and any two adjacent protrusions, that is, portions of the flexible substrate in the display unit regions, are connected by the connection portion. The lead 230 may be located in the connection portion of the flexible substrate. This can further increase the tensile strength of the display panel. It should be particularly noted that shapes of the display unit regions 110, the hollow portion 120 and the lead 230 shown in the drawings are schematic and should not be construed as limiting the present disclosure.

According to an embodiment of the present disclosure, the flexible substrate 100 may further have a curved portion protruding toward the back film 600, the curved portion is located between two adjacent protrusions, and a gap is provided between the flexible substrate and the protection layer at the curved portion. The schematic structural diagram of the display panel may be as shown by (b) of FIG. 6. Thereby, the tensile strength of the display panel can be further improved.

In another aspect, the present disclosure provides a method for manufacturing the display panel described above. The method may include a step of providing a plurality of organic light-emitting elements on a flexible substrate, i.e. the flexible substrate may have a flat second surface and a first surface opposite to the second surface, the first surface having a plurality of protrusions thereon, orthographic projections of the organic light-emitting elements on the flexible substrate being located within regions of the protrusions. The method has advantages of simple operation, high yield, low production cost and the like, and the display panel obtained by the method has all characteristics and advantages of the display panel described above, which will not be repeated herein. The function of the protrusions in the display panel and the principle of the display panel achieving the above beneficial effects have been described in detail, and are not described again here.

Figure 7:
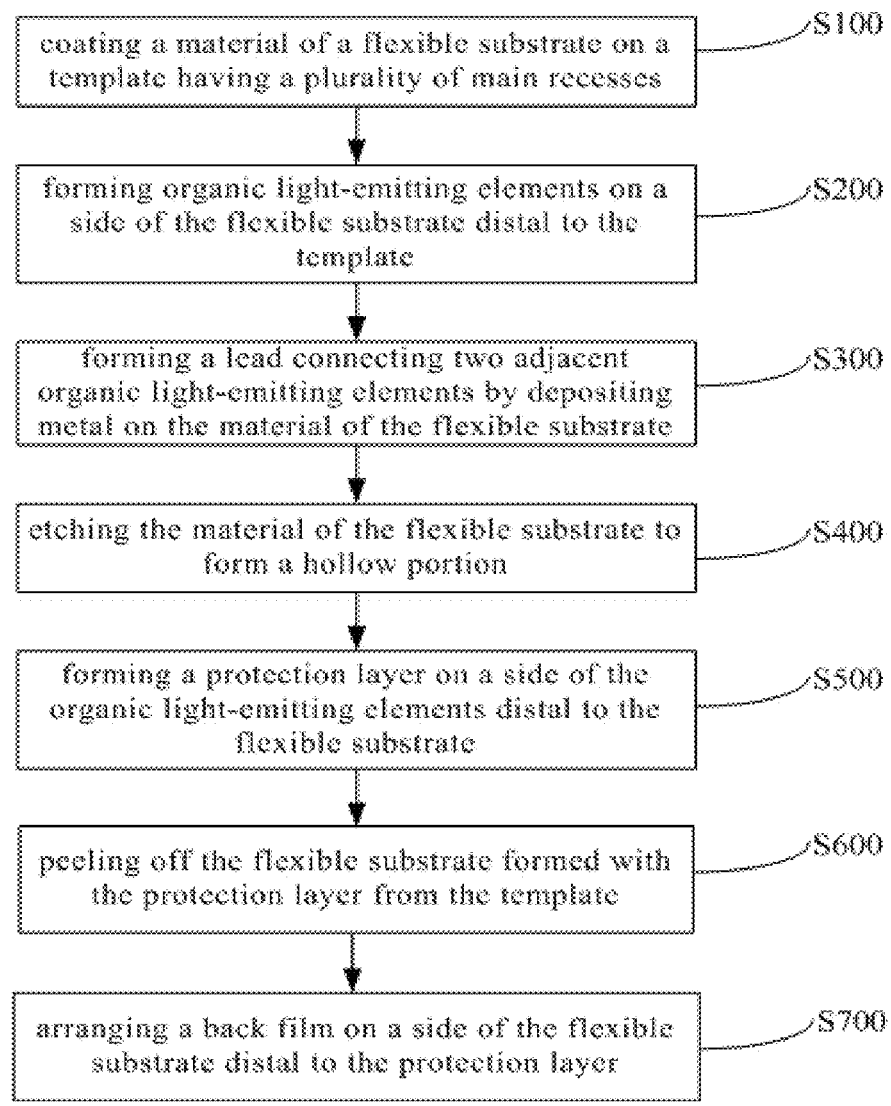
FIG. 7 shows a schematic flowchart of a method for manufacturing a display panel according to an embodiment of the present disclosure.

The various steps of the method are described in detail below, in accordance with specific embodiments of the present disclosure. Referring to FIG. 7, the method may include following steps S100 through S700.

S100: coating a material of a flexible substrate on a template having a plurality of main recesses.

Figure 9A:
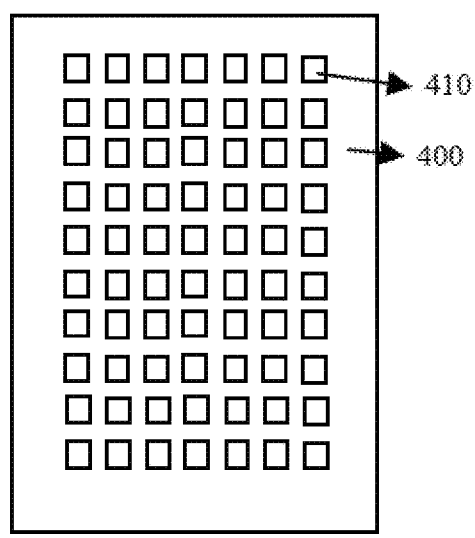
FIGS. 9A, 9B, and 9C each show a schematic structural diagram of a template according to an embodiment of the present disclosure.
Figure 9B:
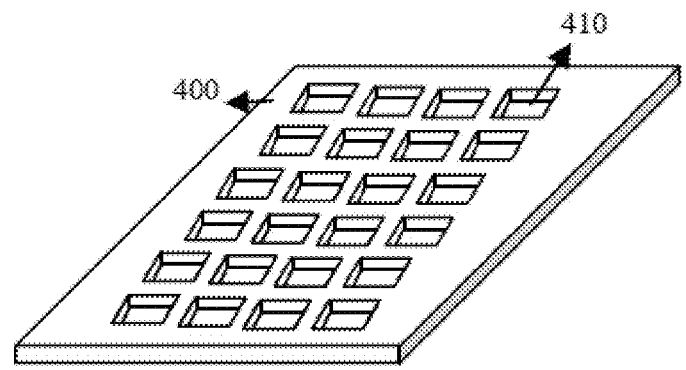
Figure 9C:
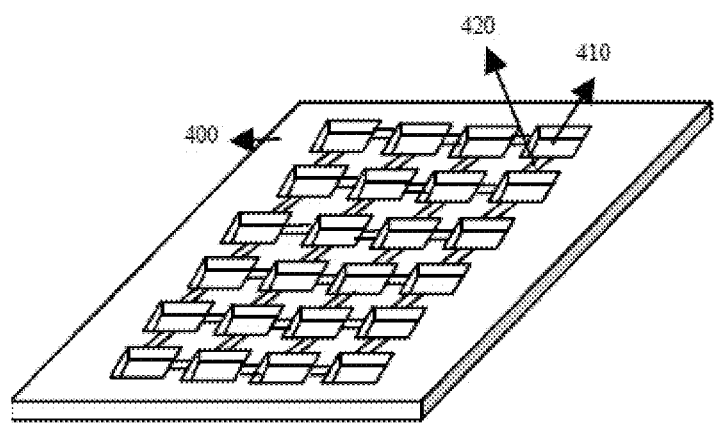

According to an embodiment of the present disclosure, the method may further include a step of forming the flexible substrate. The step of forming the flexible substrate may include a step of coating the material of the flexible substrate on the template having the plurality of main recesses. Referring to FIGS. 9A and 9B, the main recesses 410 on the template 400 may be used to form protrusions of the flexible substrate. As described above, since the flexible substrate can have a thickness stepped by the protrusions, that is, a total thickness of the flexible substrate at the protrusions can be comparable to a thickness of a flexible substrate in a display panel commonly used at present. Therefore, a depth of the main recesses 410 of the template 400 can be reduced to be equal to or slightly smaller than a thickness of a current flexible substrate. While the main recesses 410 are typically formed by etching the template 400, thereby advantageously reducing a cost of manufacturing the template for forming the flexible substrate. The template 400 may further have a connection recess 420 between two adjacent main recesses 410, and as shown in FIG. 9C, the connection recess 420 may be used to form a connection portion of the flexible substrate. According to an embodiment of the present disclosure, a depth of the connection recess 420 may be slightly less than the depth of the main recesses 410. After the material of the flexible substrate is coated on the template 400, the flexible substrate can be simply formed through steps such as curing.

As mentioned above, the flexible substrate may include a hollow portion or the like. Since the flexible substrate is formed by coating the material of the flexible substrate on the template 400, no recess would be provided at a position of the template 400 for forming the hollow portion, and thus the material of the flexible substrate would not be formed at the position of the template 400 for forming the hollow portion during the step of coating, and the hollow portion would be naturally formed. Alternatively, the hollow portion may be formed by a subsequent etching step: after the material of the flexible substrate is dried, selectively etching the material of the flexible substrate, to remove the material in a region corresponding to the hollow portion.

S200: forming organic light-emitting elements on a side of the flexible substrate distal to the template.

Figure 4:
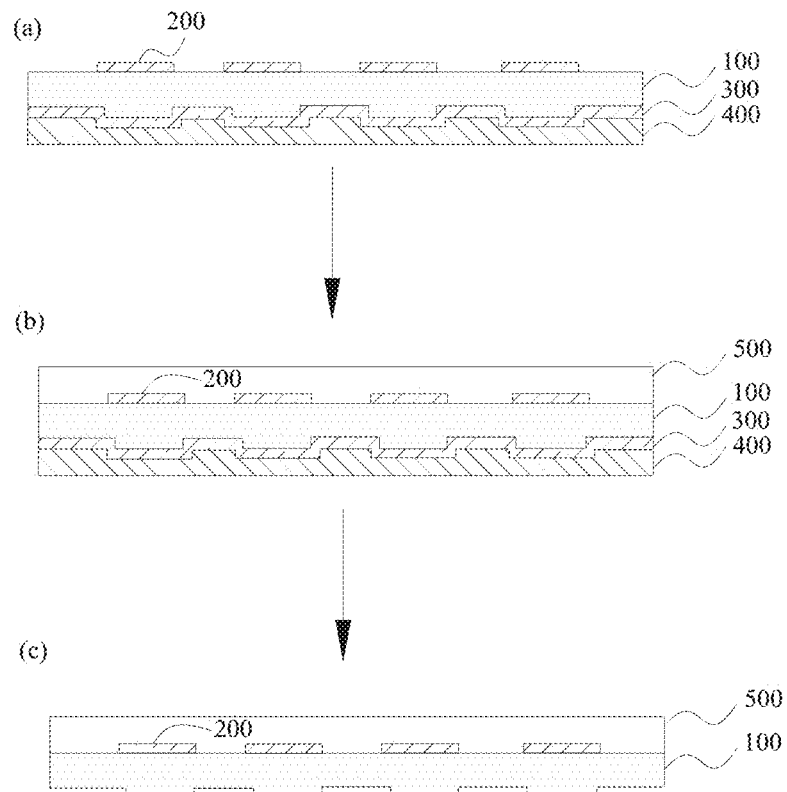
FIG. 4 shows a schematic view illustrating a part of a method for manufacturing a display panel according to an embodiment of the present disclosure.

According to an embodiment of the present disclosure, referring to (a) of FIG. 4, after the material of the flexible substrate is cured, the material may not be peeled off from the template, but a step of disposing the organic light-emitting elements may be performed first. Therefore, a rigid template may be utilized for convenience of subsequent processes. Specifically, the step may include steps of providing organic light-emitting diodes 210, providing package structures 220, and the like, and may further include a step of providing a control circuit for controlling the organic light-emitting diodes to emit light, for example, may include a step of forming a thin film transistor.

S300: forming a lead connecting two adjacent organic light-emitting elements by depositing metal on the material of the flexible substrate.

In accordance with an embodiment of the present disclosure, the lead 230 may be formed in a region other than the protrusions in this step (e.g., as shown in FIG. 8). Specifically, after the plurality of organic light-emitting elements 200 are disposed on the first surface of the flexible substrate, metal may be deposited at a position corresponding to the connection portion of the flexible substrate, and a patterning process including etching may be performed to form the lead 230 for connecting two organic light-emitting elements 200.

S400: etching the material of the flexible substrate to form a hollow portion.

According to an embodiment of the present disclosure, when the hollow portion 120 needs to be formed by etching after the material of the flexible substrate is cured, an etching process may be performed on the material of the flexible substrate after the lead 230 is formed. In some embodiments of the present disclosure, the step of etching the material of the flexible substrate may be performed in synchronization with the patterning process involved in the previous step.

S500: forming a protection layer on a side of the organic light-emitting elements distal to the flexible substrate.

According to an embodiment of the present disclosure, in this step, the protection layer 500 covering the organic light-emitting elements 200 may be formed. Thereby, the organic light-emitting elements can be protected by the protection layer 500, so that a reliability of the display panel obtained by the method can be further improved. The structure obtained by this step may be as shown by (b) of FIG. 4.

S600: peeling off the flexible substrate formed with the protection layer from the template.

According to an embodiment of the present disclosure, after the protection layer 500 is formed, an operation of peeling the flexible substrate from the template may be performed. In this step, separation of the template from the flexible substrate may be achieved by laser, or, referring to (a) through (c) of FIG. 4, separation of the flexible substrate 100 from the template 400 may also be achieved by a release layer 300 disposed therebetween, and the release layer 300 may be formed first before the material of the flexible substrate is coated on the template 400. The release layer 300 may be an adhesive layer made of a material that can be dissolved by a specific solvent, or a material that can be removed by another process. After the release layer 300 is removed, the flexible substrate 100 and the template 400 on both sides of the release layer 300 are automatically separated. Thereby, a structure as shown by (c) of FIG. 4 can be obtained.

S700: arranging a back film on a side of the flexible substrate distal to the protection layer.

Figure 5:
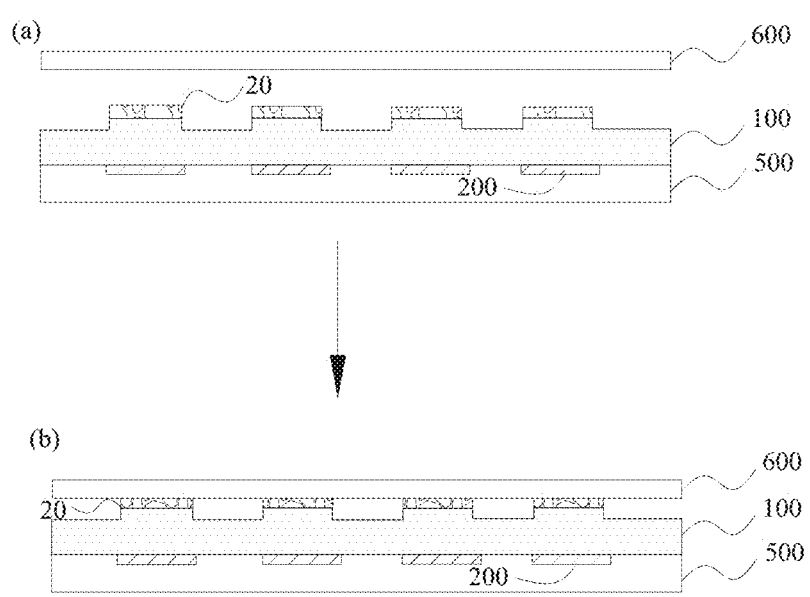
FIG. 5 shows a schematic view illustrating a part of a method for manufacturing a display panel according to an embodiment of the present disclosure.

According to an embodiment of the present disclosure, the back film 600 may be arranged in this step, thereby protecting the side of the flexible substrate facing away from the organic light-emitting elements. Specifically, the back film 600 may be arranged by using the protrusions. As described above, each of the protrusions at the surface of the flexible substrate may have a platform on a side thereof away from the organic light-emitting elements 200, and thus, an adhesive layer 20 may be provided on at least one of the platform and the back film 600, and the back film may be fixed to the flexible substrate by the adhesive layer 20. For example, referring to FIG. 5, an optical adhesive as the adhesive layer 20 may be disposed on platforms of the protrusions, and then an adhering of the back film 600 may be achieved.

Figure 6:
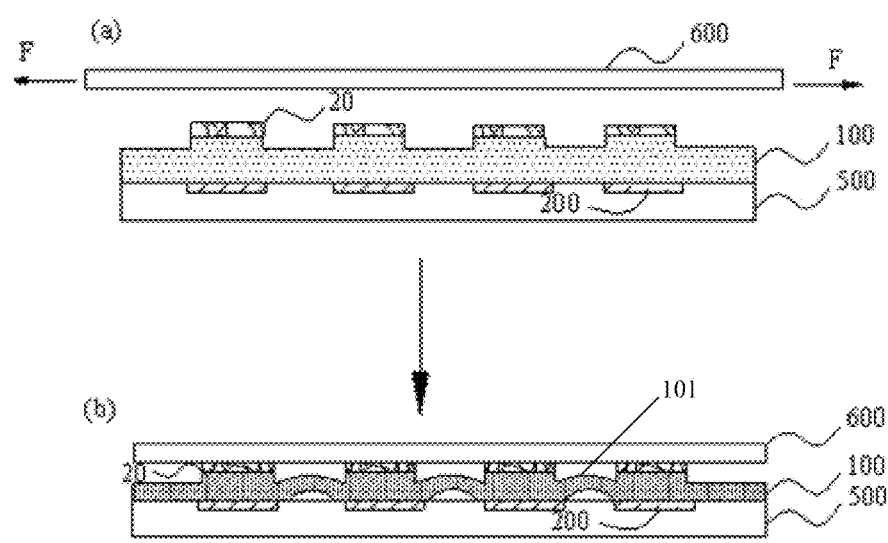
FIG. 6 illustrates a schematic view illustrating a part of a method for manufacturing a display panel according to an embodiment of the present disclosure.

According to other embodiments of the present disclosure, referring to FIG. 6, before the back film 600 is adhered to the flexible substrate 100, the back film 600 may be stretched along an adhering plane (in a direction shown by the arrow F in the drawing) in advance. After the adhering, the back film is loosened to restore the back film to the state before stretching. Thereby, a curved portion 101 can be formed by the flexible substrate 100 through a tensile force of restoring of the back film, the flexible substrate 100 at the curved portion 101 is not in contact the protection layer 500, and a gap is formed between the flexible substrate 100 at the curved portion 101 and the protection layer 500, thereby further improving the tensile strength of the display panel.

In yet another aspect, the present disclosure provides a display device including the display panel described above. Therefore, the display device has all features and advantages of the display panel described above, and will not be described herein again. Generally, the display device has at least one of the advantages of low production cost, deformation space of higher freedom, high tensile strength and the like.

Terms throughout this specification such as "an embodiment", "the embodiment" or the like, mean that a particular feature, structure, material, or characteristic described in connection with the embodiment is included in at least one embodiment of the present disclosure. In this specification, schematic representations of the terms used above are not necessarily intended to refer to the same embodiment or example. Furthermore, particular features, structures, materials, or characteristics described may be combined in any suitable manner in any one or more embodiments or examples. Moreover, various embodiments or examples and features of various embodiments or examples described in this specification can be combined by those skilled in the art without being mutually inconsistent.

While embodiments of the present disclosure have been shown and described above, it should be understood that the above embodiments are exemplary and not to be construed as limiting the present disclosure, and changes, modifications, substitutions and alterations may be made to the above embodiments by those of ordinary skill in the art within the scope of the present disclosure.

The invention claimed is:

1. A display panel, comprising:
a flexible substrate having a first surface and a second surface opposite to the first surface, wherein the first surface is provided with a plurality of protrusions;
a plurality of organic light-emitting elements arranged on the second surface of the flexible substrate, wherein orthographic projections of at least a portion of the plurality of organic light-emitting elements on the flexible substrate are located in regions where the plurality of protrusions are located, wherein the display panel further comprises a lead connecting two adjacent organic light-emitting elements, wherein at least a portion of an orthogonal projection of the lead on the flexible substrate is located outside the regions where the plurality of protrusions are located.

2. The display panel according to claim 1, wherein the flexible substrate has a hollow portion and a connection portion, the hollow portion is located between the plurality of protrusions, any two adjacent ones of the plurality of protrusions are connected by the connection portion, and the lead is located in the connection portion of the flexible substrate.

3. The display panel according to claim 1, wherein heights of the plurality of protrusions are equal to each other, a thickness of the flexible substrate at the protrusions ranges from 5 micrometers to 20 micrometers, and a minimum thickness of the flexible substrate is not less than 2 micrometers.

4. The display panel according to claim 1, further comprising:
a back film arranged on a side of the flexible substrate distal to the organic light-emitting elements, each of the protrusions is provided with a platform on its side distal to the organic light-emitting elements, the platform is provided with a first adhesive layer, and the back film is adhered to the flexible substrate through the first adhesive layer.

5. The display panel according to claim 4, wherein the back film is provided with a second adhesive layer on a side thereof facing the flexible substrate, and the back film is adhered to the flexible substrate by the first adhesive layer and the second adhesive layer.

6. The display panel according to claim 5, further comprising:
a protection layer positioned on a side of the flexible substrate, which is provided with the organic light-emitting elements, wherein the protection layer covers the organic light-emitting elements.

7. The display panel according to claim 6, wherein the flexible substrate has a curved portion which is convex towards the back film, the curved portion is located between two adjacent protrusions, and a gap is provided between the flexible substrate and the protection layer at the curved portion.

8. A display device, comprising the display panel according to claim 1.

9. A method for manufacturing a display panel, comprising:
preparing a flexible substrate having a plurality of protrusions, wherein the flexible substrate has a first surface and a second surface opposite to the first surface, and the plurality of protrusions are disposed on the first surface; and
forming a plurality of organic light-emitting elements on the second surface of the flexible substrate, wherein orthographic projections of at least a portion of the organic light-emitting elements on the flexible substrate are positioned in regions where the protrusions are positioned, wherein
the preparing the flexible substrate having the plurality of protrusions comprises: coating a material of the flexible substrate on a template with a plurality of main recesses for forming the plurality of protrusions on the flexible substrate; and
the preparing the flexible substrate having the plurality of protrusions further comprises a step of forming a connection portion between adjacent protrusions, and
the step of forming the connection portion comprises: coating the material of the flexible substrate on the template with a connection recess between two adjacent main recesses, wherein a depth of the connection recess is less than that of the main recesses, and the connection recess is used for forming the connection portion.

10. The method according to claim 9, further comprising:
after forming the plurality of organic light-emitting elements on the second surface of the flexible substrate, forming a lead for connecting two of the organic light-emitting elements by depositing metal on the connection portion of the flexible substrate.

11. The method according to claim 10, further comprising:
after forming the lead for connecting two of the organic light-emitting elements, etching a portion of the material of the flexible substrate to form a hollow portion, so that the hollow portion is located between the plurality of protrusions, and there is no overlapping region between an orthographic projection of the hollow portion on the template and an orthographic projection of the lead on the template;
forming a protection layer on a side of the organic light-emitting elements distal to the flexible substrate, wherein the protection layer covers the organic light-emitting elements;
peeling off the flexible substrate formed with the protection layer from the template; and
arranging a back film on a side of the flexible substrate distal to the protection layer.

12. The method according to claim 11, wherein the arranging the back film on the side of the flexible substrate distal to the protection layer comprises:
arranging an adhesive layer on a side of the plurality of protrusions distal to the organic light-emitting elements and/or on the back film, and adhering the back film to the flexible substrate through the adhesive layer.

13. The method according to claim 12, further comprising:
prior to adhering the back film to the flexible substrate through the adhesive layer, stretching the back film along an adhering plane in advance, and after the adhering, causing the back film to restore to a state before the stretching.

14. The method according to claim 11, wherein the peeling off the flexible substrate formed with the protection layer from the template comprises: peeling off the flexible substrate formed with the protection layer from the template by laser.

15. The method according to claim 11, further comprising forming a release layer prior to coating the material of the flexible substrate on the template; and
the peeling off the flexible substrate formed with the protection layer from the template comprises removing the release layer to peel off the flexible substrate from the template.

* * * * *